US010958221B2

(12) United States Patent
Lavon et al.

(10) Patent No.: US 10,958,221 B2
(45) Date of Patent: Mar. 23, 2021

(54) FLAME SCANNER HAVING NON-LINEAR AMPLIFIER WITH TEMPERATURE COMPENSATION

(71) Applicant: Carrier Corporation, Palm Beach Gardens, FL (US)

(72) Inventors: Ronie Lavon, Derry, NH (US); Dan Melanson, Manchester, NH (US)

(73) Assignee: CARRIER CORPORATION, Palm Beach Gardens, FL (US)

( * ) Notice: Subject to any disclaimer, the term of this patent is extended or adjusted under 35 U.S.C. 154(b) by 155 days.

(21) Appl. No.: 16/342,409

(22) PCT Filed: Oct. 18, 2017

(86) PCT No.: PCT/US2017/057115
§ 371 (c)(1),
(2) Date: Apr. 16, 2019

(87) PCT Pub. No.: WO2018/075599
PCT Pub. Date: Apr. 26, 2018

(65) Prior Publication Data
US 2019/0253024 A1    Aug. 15, 2019

Related U.S. Application Data

(60) Provisional application No. 62/409,477, filed on Oct. 18, 2016.

(51) Int. Cl.
*H03F 1/30* (2006.01)
*H03G 1/00* (2006.01)
(Continued)

(52) U.S. Cl.
CPC .............. *H03F 1/30* (2013.01); *F23N 5/082* (2013.01); *H03F 1/34* (2013.01); *H03F 3/087* (2013.01);
(Continued)

(58) Field of Classification Search
CPC ................ H03F 1/30; H03F 2200/126; H03F 2200/156; H03F 2200/447;
(Continued)

(56) References Cited

U.S. PATENT DOCUMENTS

| 3,999,060 A | 12/1976 | Skagerlund |
| 5,325,071 A | 6/1994 | Westmoreland |

(Continued)

FOREIGN PATENT DOCUMENTS

| CN | 201178401 Y | 1/2009 |
| EP | 2273466 A1 | 1/2011 |
| GB | 2424978 A | 10/2006 |

OTHER PUBLICATIONS

International Search Report and Written Opinion for Application PCT/US2017/057115, dated Jan. 9, 2018, 12 pages.

*Primary Examiner* — Que Tan Le
(74) *Attorney, Agent, or Firm* — Cantor Colburn LLP

(57) ABSTRACT

An amplifier assembly (100) includes an amplifier (102) having an input terminal, an output terminal and a feedback terminal; a first feedback path connecting the output terminal to the feedback terminal; a second feedback path connecting the output terminal to the feedback terminal; a switch (124) positioned in the second feedback path, the switch (124) opening or closing in response to a voltage at the output terminal relative to a breakpoint, when the switch (124) is open, the amplifier assembly (100) has a first gain and when the switch (124) is closed, the amplifier assembly (100) has a second gain; and a thermally variable element (152) connected to the switch (124), the thermally variable element (152) configured to generate a compensation voltage to maintain the breakpoint in response to varying temperature of the switch (152).

11 Claims, 3 Drawing Sheets

(51) Int. Cl.
*H03F 3/45* (2006.01)
*H03F 3/08* (2006.01)
*H03F 1/34* (2006.01)
*F23N 5/08* (2006.01)

(52) U.S. Cl.
CPC ....... *H03F 3/45475* (2013.01); *H03G 1/0088* (2013.01); *H03F 2200/126* (2013.01); *H03F 2200/156* (2013.01); *H03F 2200/261* (2013.01); *H03F 2200/447* (2013.01); *H03F 2203/45136* (2013.01); *H03F 2203/45286* (2013.01); *H03F 2203/45518* (2013.01); *H03F 2203/45524* (2013.01); *H03F 2203/45536* (2013.01); *H03G 2201/502* (2013.01)

(58) Field of Classification Search
CPC . H03F 2203/45518; H03F 2203/45524; H03F 2203/45536; F23N 5/082; H03G 1/0088; H03G 2201/502
USPC .................................. 250/214 A, 214 R, 554
See application file for complete search history.

(56) References Cited

U.S. PATENT DOCUMENTS

| | | |
|---|---|---|
| 5,332,903 A | 7/1994 | Buehler et al. |
| 5,581,213 A | 12/1996 | Linder et al. |
| 5,708,376 A | 1/1998 | Ikeda |
| 5,808,516 A | 9/1998 | Barber |
| 6,013,919 A | 1/2000 | Schneider et al. |
| 6,246,284 B1 * | 6/2001 | Nemoto .................. H03F 3/087 |
| | | 250/214 A |
| 6,414,549 B1 | 7/2002 | Barbetta |
| 6,442,053 B1 | 8/2002 | Gowda et al. |
| 6,784,734 B2 | 8/2004 | Amourah |
| 7,005,921 B2 | 2/2006 | McCalmont |
| 7,750,738 B2 | 7/2010 | Bach |
| 7,821,341 B2 | 10/2010 | Kim et al. |
| 7,889,006 B1 | 2/2011 | Jones |
| 8,179,198 B2 | 5/2012 | Das |
| 8,456,237 B2 | 6/2013 | Huang et al. |
| 8,514,017 B2 | 8/2013 | Araki |
| 9,124,230 B2 | 9/2015 | Akyol et al. |
| 9,391,577 B2 | 7/2016 | Stroet |

\* cited by examiner and a signal conditioner 20. The sensor 14 may be a photodiode or other known type of flame sensor with a voltage output. The sensor 14 generates a detection signal in the presence of a flame. The sensor 14 may selectively generate a detection signal in response to certain wavelengths of light, such that the sensor 14 only generates a detection signal when a flame is present. The signal conditioner 20 receives the detection signal from the sensor 14 and generates an output signal that is used by a controller 50 to determine the presence of a flame. The signal conditioner 20 includes a non-linear amplifier assembly to amplify the detection signal generated by sensor 14. As the detection signal from sensor 14 can vary from a low level to a high level, the amplifier assembly employs a non-linear gain.

Figure 1:
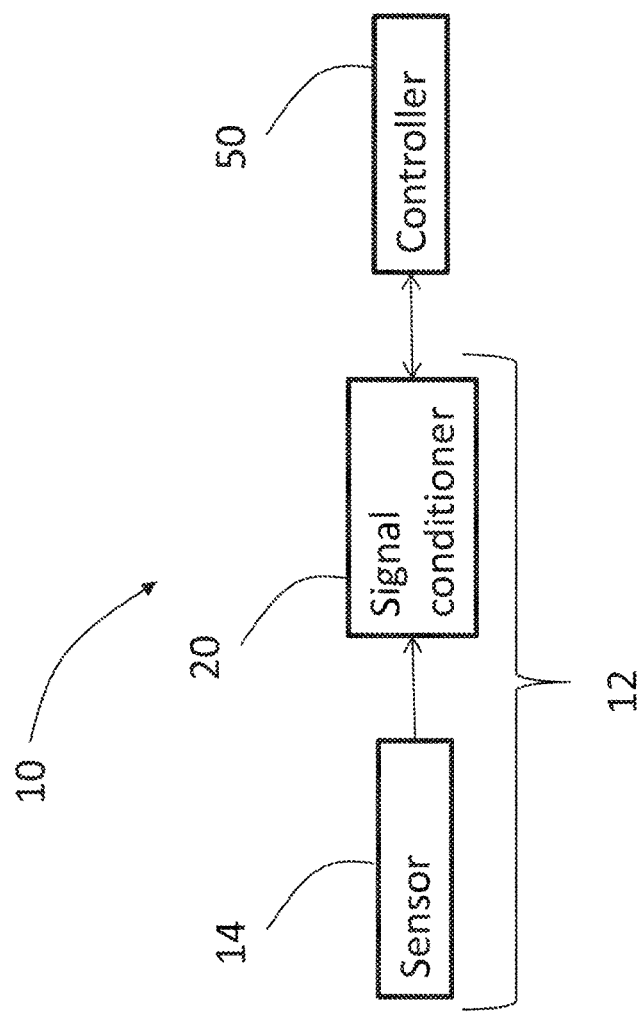
Figure 2:
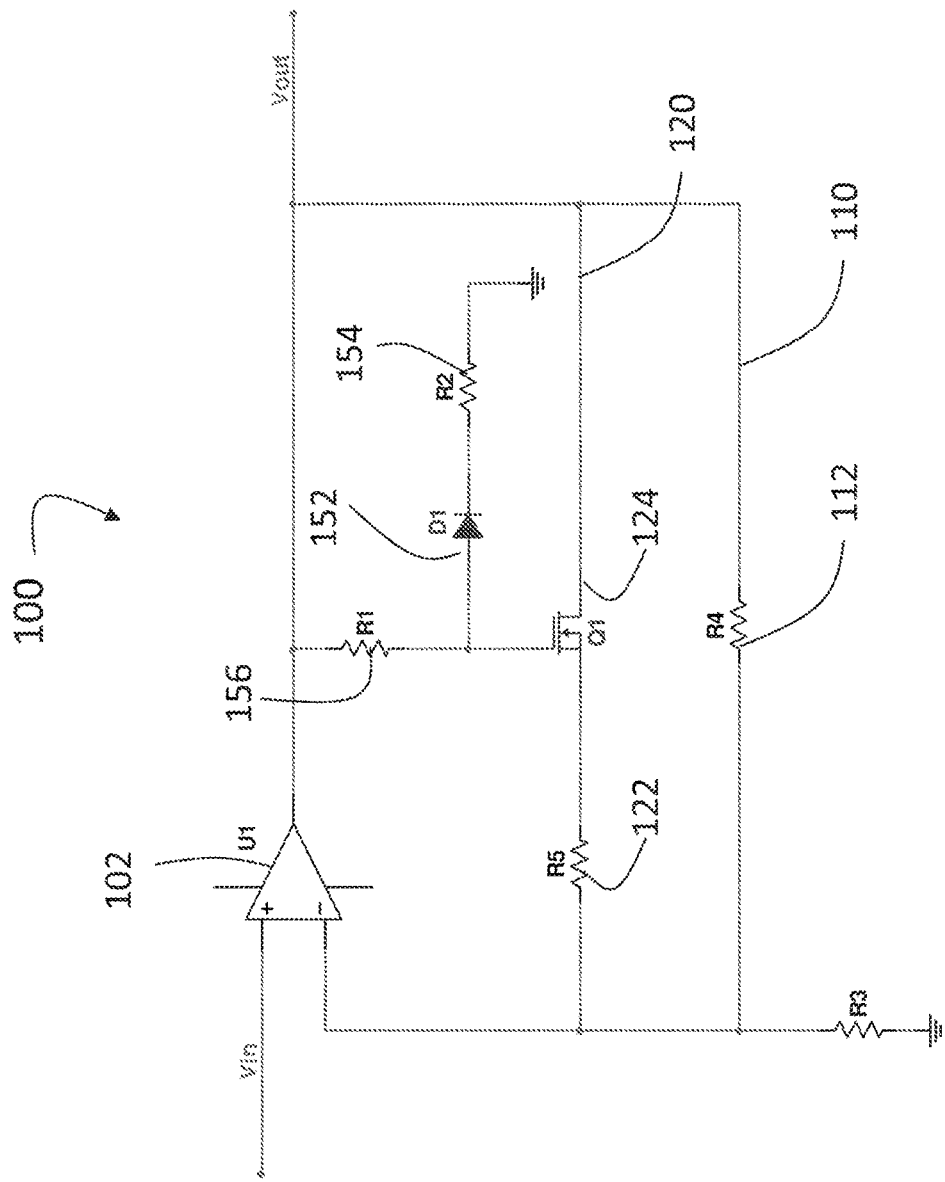

FIG. 2 is a schematic diagram of an amplifier assembly 100 in an embodiment. The amplifier assembly 100 includes an input, Vin, that receives the detection signal from sensor 14. An amplifier (e.g., an operational amplifier) receives the detection signal from sensor 14 at a non-inverting input terminal. The output at an output terminal of amplifier 102, Vout, may be provided to controller 50, or may be further processed by signal conditioner 20.

The amplifier assembly 100 uses two feedback paths from the output terminal of the amplifier 102 to a feedback terminal, e.g., the inverting input of the amplifier 102. A first feedback path 110 includes a first resistance 112. The first resistance 112 establishes a first gain for the amplifier assembly 100. A second feedback path 120 includes a second resistance 122. The second feedback path 120 is in parallel with the first feedback path 110. The second feedback path 120 also includes a switch 124, in the form of a MOSFET transistor having a gate terminal connected to the output of amplifier 102, with the drain and source terminals in series with the second feedback path 120.

Figure 3:
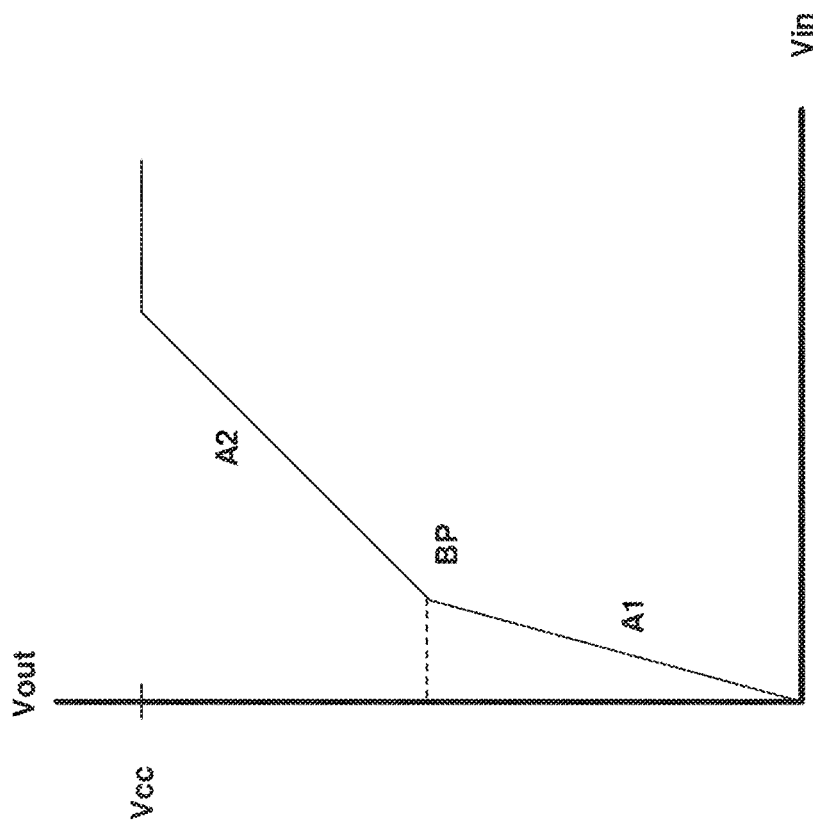

The non-linear gain of amplifier assembly 100 is depicted in FIG. 3. The first gain is shown as linear segment A1 and the second gain is shown as linear segment A2. The first gain is greater than the second gain, as indicated by the slope of A1 being greater than the slope of A2. A breakpoint, BP, identifies the transition between the first gain and the second gain.

In operation, when the output of the amplifier 102, Vout, is below the breakpoint, BP, switch 124 is open, and the gain of the amplifier assembly 100 is dictated by the first feedback path 110. In this mode, the gain of the amplifier assembly 100 is dictated by the first resistance 112. When the output of amplifier 102, Vout, is above the breakpoint, BP, switch 124 is closed, and the gain of the amplifier assembly 100 is dictated by the first feedback path 110 in parallel with the second feedback path 120. In this mode, the gain of the amplifier assembly 100 is dictated by the first resistance 112 and the second resistance 122 in electrical parallel. The second gain is lower than the first gain, as the net resistance of the first resistance 112 and the second resistance 122 in parallel is lower than the first resistance 112.

The amplifier assembly 100 also includes a temperature compensation element 152, which maintains the breakpoint, BP, at a consistent voltage even when the temperature of the amplifier assembly 100 varies. The voltage at the gate terminal of switch 124 is set by a voltage divider across resistors 156 and 154. As temperature increases, the turn-on voltage of the switch 124 will decrease. Unless compensated for, this will cause the breakpoint to go down with increasing temperature, and introduce unwanted variance in the gain of the amplifier assembly 100. To compensate for temperature variations, a temperature compensation element 152 is connected to the gate terminal of the switch 124, in series with and between the resistors 156 and 154. In FIG. 2, the thermally variable element 152 is a diode. The voltage at the gate terminal of switch 124 is $Vout(R2/(R1+R2))+Vcomp$, where Vcomp is a compensation voltage provided by the thermally variable element 152. It is understood that the thermally variable element 152 may be implemented with other devices, and embodiments are not limited to use of a diode.

In the example of FIG. 2, the compensation voltage is the forward bias voltage drop across the diode 152. In operation, as temperature increases, the forward bias voltage of diode 152 decreases. This lowers the voltage at the gate terminal of switch 124, so that the Vout breakpoint, BP, remains substantially constant even with varying temperature.

The amplifier assembly 100 provides two distinct gains, A1 and A2. When the detection signal is low (e.g., Vout less than the breakpoint), the amplifier assembly 100 provides a first gain. When the detection signal is high (e.g., Vout greater than the breakpoint), the amplifier assembly 100 provides a second gain. The second gain is lower than the first gain.

While the disclosure has been described in detail in connection with only a limited number of embodiments, it should be readily understood that the disclosure is not limited to such disclosed embodiments. Rather, the disclosure can be modified to incorporate any number of variations, alterations, substitutions or equivalent arrangements not heretofore described, but which are commensurate with the spirit and scope of the disclosure. Additionally, while various embodiments of the disclosure have been described, it is to be understood that aspects of the disclosure may include only some of the described embodiments. Accordingly, the disclosure is not to be seen as limited by the foregoing description, but is only limited by the scope of the appended claims.

The invention claimed is:

1. An amplifier assembly comprising:
   an amplifier having an input terminal, an output terminal and a feedback terminal;
   a first feedback path connecting the output terminal to the feedback terminal;
   a second feedback path connecting the output terminal to the feedback terminal;
   a switch positioned in the second feedback path, the switch opening or closing in response to a voltage at the output terminal relative to a breakpoint, when the switch is open, the amplifier assembly has a first gain and when the switch is closed, the amplifier assembly has a second gain; and
   a thermally variable element connected to the switch, the thermally variable element configured to generate a compensation voltage to maintain the breakpoint in response to varying temperature of the switch.

2. The amplifier assembly of claim 1 wherein the first feedback path includes a first resistance.

3. The amplifier assembly of claim 2 wherein the second feedback path includes a second resistance.

4. The amplifier assembly of claim 3 wherein when the switch is open, the first gain is in response to the first resistance.

5. The amplifier assembly of claim 3 wherein when the switch is closed, the second gain is in response to the first resistance and the second resistance.

6. The amplifier assembly of claim 1 wherein the first feedback path and second feedback path are in electrical parallel.

7. The amplifier assembly of claim 1 wherein the switch is a transistor.

8. The amplifier assembly of claim 7 wherein the transistor is a MOSFET.

9. The amplifier assembly of claim 1 wherein the thermally variable element is a diode.

10. The amplifier assembly of claim 1 wherein thermally variable element contributes a compensation voltage, the compensation voltage decreasing with increasing temperature.

11. A flame scanner including the amplifier assembly of claim 1.

* * * * *